United States Patent [19]

Simon et al.

[11] 4,386,821
[45] Jun. 7, 1983

[54] OPTO-ELECTRONIC COUPLING HEAD AND METHOD FOR FITTING SUCH A HEAD

[75] Inventors: Jacques Simon; Bernard Defaut, both of Paris, France

[73] Assignee: Thomson-CSF, Paris, France

[21] Appl. No.: 193,019

[22] Filed: Oct. 2, 1980

[30] Foreign Application Priority Data

Oct. 5, 1979 [FR] France ............................... 79 24892

[51] Int. Cl.³ ............................................. G02B 5/14
[52] U.S. Cl. ................................................. 350/96.2
[58] Field of Search ................... 350/96.18, 96.2, 96.21

[56] References Cited

U.S. PATENT DOCUMENTS 4,144,541  3/1979  Schaefer et al. ..................... 357/81
4,233,619  11/1980  Webb et al. ......................... 350/96.2
4,255,015  3/1981  Adams et al. ....................... 350/96.2

Primary Examiner—Eli Lieberman
Attorney, Agent, or Firm—Oblon, Fisher, Spivak, McClelland & Maier

[57] ABSTRACT

An opto-electronic coupling head which can either be an emission head coupling a light emitting diode to an optical fiber, or a reception head coupling an optical fiber to a photodiode. The head has a diode mounted on the base of a case for a semiconductor device and uses the cap of said case which has previously been stamped and perforated at the top. A fiber holder has a shoulder which abuts against the edges of the opening made in the cap and in conjunction with the electric welding of the cap to the base helps to fix the fiber holder in the case. The optical fiber is previously fixed by a deposit of solder in the axial opening of the fiber holder.

6 Claims, 5 Drawing Figures

OPTO-ELECTRONIC COUPLING HEAD AND METHOD FOR FITTING SUCH A HEAD

FIELD OF THE INVENTION

BACKGROUND OF THE INVENTION

The invention relates to an opto-electronic coupling head which can either be an emission head or a reception (or detection) head.

DESCRIPTION OF THE PRIOR ART

It is known that an otical fiber telecommunications link can have:

an emission head incorporating an optical emitter modulated by the information to be transmitted and which is for example a light emitting diode or a laser diode, coupled to an optical fibre section;

at least one connector coupling the optical fibre section to one or more optical fibers;

at least one optical cable comprising a variable number of fibers, whereof one or more are allocated to the transmission of the information coming from the emitter;

at least one connector coupling the optical fiber or fibers for the transmission using an optical fiber section;

a reception (or detection) head incorporating an optical fibre section coupled to an optical receiver (or detector-photodiode) which restores the information into an electrical form.

A complete link comprises a link of the type referred to hereinbefore in each transmission direction.

Problems are encountered in the construction of an emission or reception head. These can be of a mechanical nature because it is necessary to ensure the positioning and the fixing in the optimum position of the opto-electronic component (emitter or receiver) with respect to the terminal surface (input or output) of the optical fiber section. They can also be of an electrical and optical nature with regard more particularly to the sealing of the components so as to ensure and provide a good electrical insulation of the head components and the optical quality of the optical or opto-electronic members.

The known constructions are complex and expensive, particularly in the case of very small diameter telecommunications fibers (e.g. approximately 100 microns), mainly due to the need to fit the fiber into the coupling head whilst checking, during fitting, the good quality of the optical transmission by the so-called "dynamic control" method.

In a simpler construction, a fiber holder is used which is perforated to the same size as the optical fiber and serves as a protective cap for the head. This solution makes it necessary to use for the fibre holder a material such as nickel or an alloy of iron, nickel and cobalt weldable to the base of the type used in semiconductor technology. However, these materials have the disadvantage of being very difficult to perforate or drill over considerble lengths with respect to the perforating diameter, i.e. the diameter of a telecommunications optical fiber.

BRIEF SUMMARY OF THE INVENTION

The invention obviates the disadvantages of the known constructions by using a standard case with a semiconductor base and cap.

The present invention therefore relates to an opto-electronic coupling head of the type incorporating a device for supporting an opto-electronic component, the opto-electronic component itself, an optical fiber positioning device called a fibre holder, an optical fiber section and finally an encapsulating device constituted by a standard semiconductor case incorporating a base and a cap which has a circular opening via which the fiber holder leaves the case, wherein in that part of the fiber holder which bears on the base a slot is provided in which is located the opto-electronic component, whilst in its opposite part it has a shoulder against whose annular face bears the edge of the circular opening of the cap made in a previously stamped portion of the upper central part of the cap.

BRIEF DESCRIPTION OF THE DRAWINGS

The invention is described in greater detail hereinafter relative to non-limitative embodiments and the attached drawings, wherein there is shown.

DETAILED DESCRIPTION OF THE PREFERRED EMBODIMENTS

Figure 1:
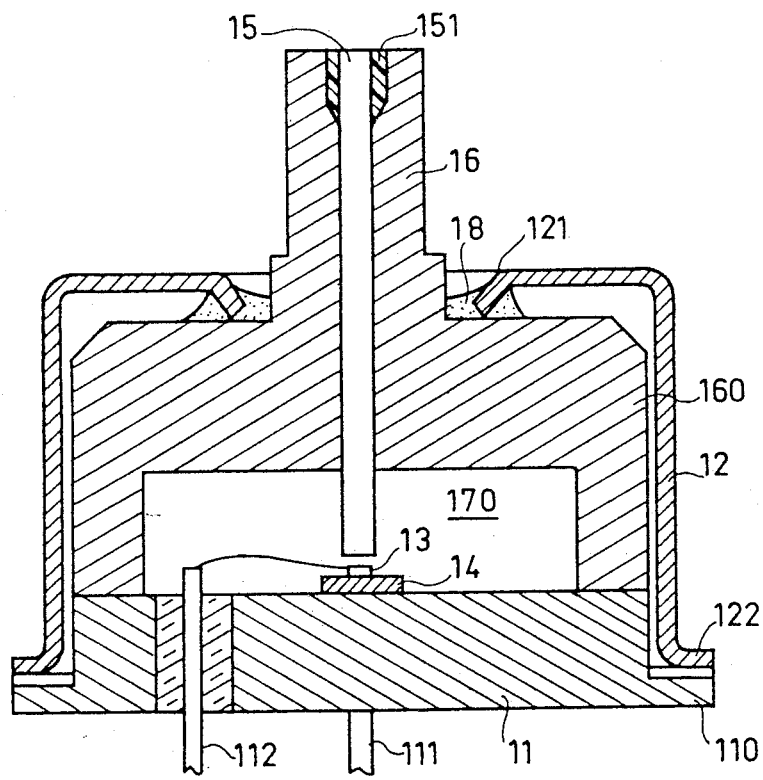
FIG. 1 a diagrammatic section of an emission head according to the invention.

In the diagram of FIG. 1 which relates to an emission head, a case of the type in standard use for semiconductor devices, has a base 11, for example made from an alloy of iron, nickel and cobalt with an expansion coefficient close to that of glass and a metal cap 12. The base is traversed by insulating passages of electrical connections 111 and 112 of the "glass bead" type for energizing the opto-electronic component of the head. In FIG. 1, it is for example a light emitting diode 13 mounted on a support 14. The latter is, for example, a ceramic washer metallized on its two opposite faces or only on the face receiving the diode, the earthed connection 111 being welded to the metallized face. Support 14 could also comprise a copper washer in order to facilitate heat dissipation, which may be necessary in the case of a relatively powerful opto-electronic emitter. In the latter case, connection 111 would serve therefore no useful purpose, the earth being any random point on the base or cap. Finally, support 14 can be parallelepipedic.

FIG. 1 also shows a fiber holder 16, whose median portion has a shoulder 160 whose diameter is equal to the internal diameter of the cap 12, less 0.01 mm, with a tolerance of the same order of magnitude. This fiber holder encloses a fiber 15 fixed by glue, resin or solder, particularly in the upper part of the fiber holder by a deposit 151. Shoulder 160 has a recess 170 which houses the component and its connections, whilst having a vertical clearance permitting an optimum regulation of the coupling of the component and the input face (or the output face in the case of a reception head) of the optical fiber.

The upper part of the fiber holder 16 emerges from the upper part of cap 12 via a central opening, whose edge 121 is downwardly inclined. A deposit 18 of glue, resin or solder is made around the fibre holder in order to seal the cap on the shoulder 160. The stage when this deposit is made will be described hereinafter.

Base 11 also has a border 110, which is less thick than the central portion, in order to facilitate electric welding of the widened edge 122 of cap 12 onto the periphery of base 11. This welding operation is described hereinafter.

The manufacturing and fitting process for the fiber holder and the head assembly involves, for example, the following stages:

(a) The manufacture of the fibre holder on a lathe, involving the machining of shoulder 160, a supplementary shoulder 2 providing a reference plane for the position of the terminal faces of the optical fiber section and also involving the making of an axial orifice.

(b) The fixing of the fiber in the central opening of the fiber holder so as to place one of the terminal faces of the fibre in the plane corresponding to the optimum coupling of said face and of the opto-electronic component.

Figures 2, 3:
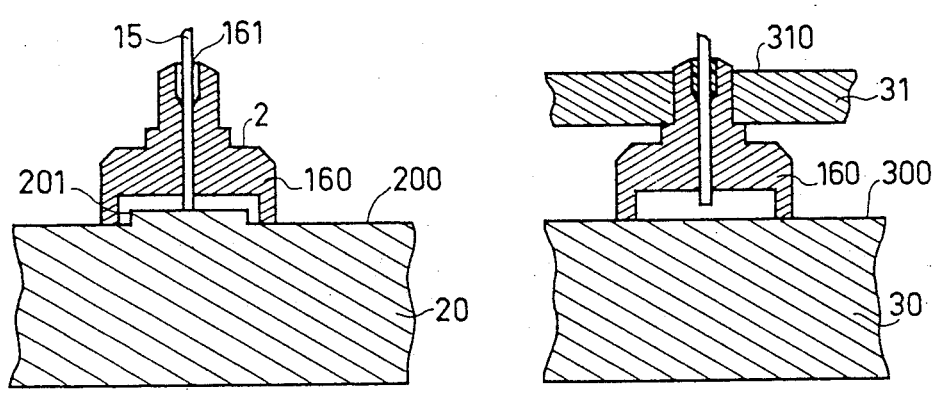
FIGS. 2, 3 and 4 different stages in the manufacture and/or fitting of the head of FIG. 1.

To this end, a tool 20 (FIG. 2) is used, which has a reference plane 200 and a platform 201, whose height is equal to the dimensions of the photo-emitting or photo-receiving face of the component, plus a gap calculated as a function of the aforementioned optimum coupling.

Section 15 is slid in the central opening of fiber holder 16 until it abuts against platform 201. The fiber is then fixed by filling with glue, resin or solder a widened portion 161 of the central opening located, for example, on the upper part of the latter.

(c) Grinding and polishing the upper part of the fiber holder and the actual fiber using a tool 30 having a supporting plane 300 which, during this stage, supports the lower part 160 of the fiber holder and which also has a collar 31 bearing against the shoulder 2 of the fiber holder and whose upper face 310 defines a limit plane for the grinding and polishing.

(d) Stamping and perforating the cap using conventional means to which are added tools adapted to the size of cap 12.

Figure 4:
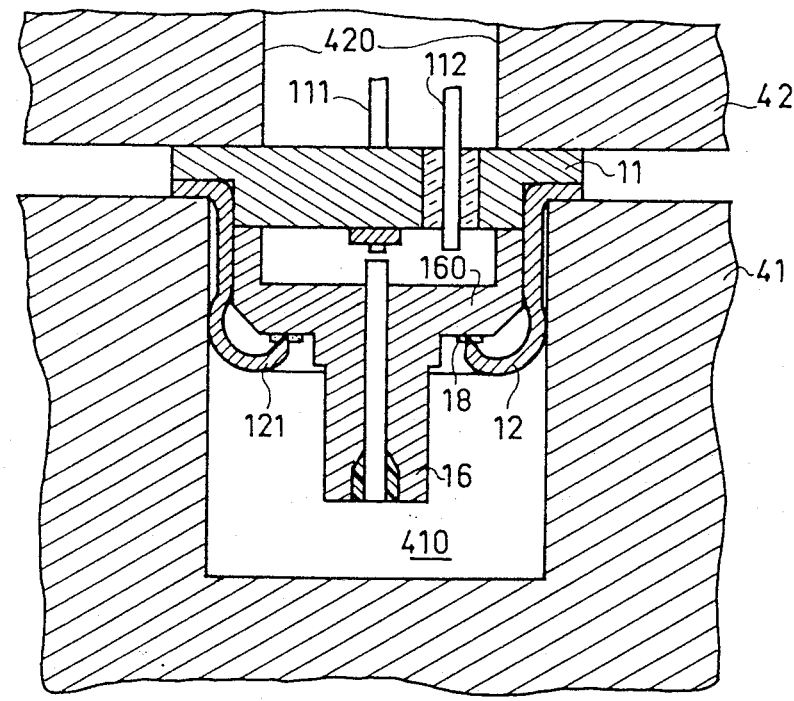

(e) Sealing the cap using electric welding means using electrodes shaped so as to adapt to the head. Thus, the electrodes must compress shoulder 160 of the fibre holder against the circular edge 121 of cap 12 during the operation. FIG. 4 partly shows the electrodes 41 and 42 of the electric welding machine used in this operation. Electrode 42 bears against base 11 and has a circular opening 420 for the passage of connections 111, 112 in order to prevent the crushing thereof. Electrode 41 has a cavity 410 for receiving the previously stamped and perforated cover 12. The depth of the cavity is sufficiently great to leave the apex 16 of fiber holder 160 free during the electric welding operation. Between the cap and shoulder 160 there is a low temperature welding preform serving the function of the deposit 18 in FIG. 1.

Figure 5:
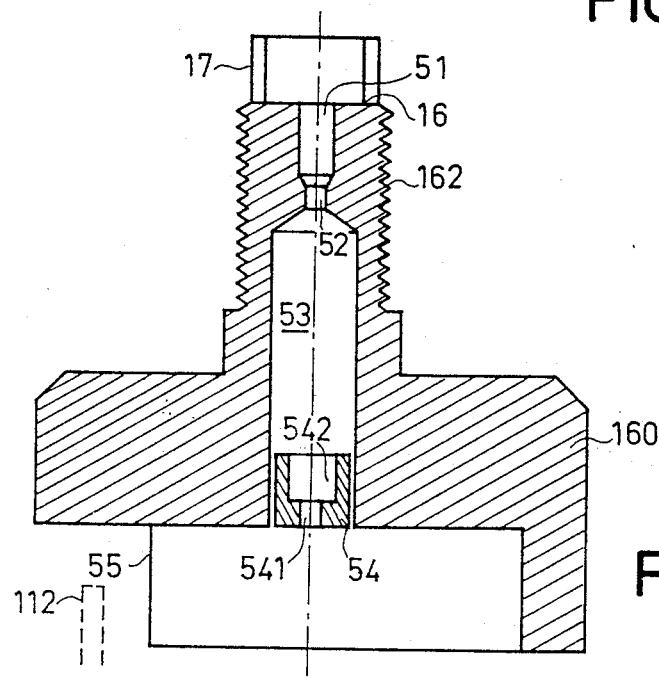
FIG. 5 a variant of the invention.

The invention covers a number of variants, particularly with respect to the fiber holder. FIG. 5 shows a fiber holder with the special features corresponding to the following variants:

(1) The upper part 16 of the fiber holder also has a cylindrical mechanical centering apparatus 17 with a complementary thread 162 making it possible to form a disconnectable connector for an optical fiber, by combining the opto-electronic head and an optical fiber termination, which itself has a matching thead.

(2) The axial opening of the fiber holder is complex and has, for example, three portions with different internal diameters. The first portion 51 has an internal diameter greater than that of the optical fiber in order to permit the fixing of the latter by a deposit of solder, resin or glue. The second portion 52, which is shorter in order to permit the precise drilling of small diameter holes (<300μ) has substantially the same diameter as the optical fiber, but must still allow the latter to slide freely. The third portion 53 has a much wider cylinder and houses a sleeve 54 which force-slides in the cylinder. This sleeve, which is to be traversed by the fiber, has a portion 541 with the same diameter as the latter and a larger diameter portion 542. This is in order to permit the machining of very small diameter holes, which cannot be economically made for long lengths.

(3) The lower part of the fiber holder has a notch 55 for leaving free the connections of passages 111, 112 of the base. This notch is necessary when passages 111, 112 are very close to the base periphery, as in the case in certain models (TO 18-TO46).

(4) The interior of the case must be filled with a neutral gas before welding the cap.

The sealing of the cap at its upper central opening when using a low temperature tin welding preform, has the advantage of not melting the weld deposit 151 (FIG. 1) and of not compromising the fixing of the fiber.

What is claimed is:

1. In an opto-electronic coupling head of the type incorporating a device for supporting an opto-electronic component, the improvement comprising:
    an optical fiber section;
    a fiber holder for positioning an optical fiber section;
    an encapsulating device including a semiconductor case having a base and a cap, said cap having a circular opening via which the fiber holder extends through the case, wherein said fiber holder on one end bears against said base of said case and wherein a slot is provided at said one end in which said opto-electronic component is situated, the other end of said fiber holder being formed with a shoulder having an annular face which bears against the edge of said circular opening of said cap and wherein said shoulder has a diameter substantially equal to the internal diameter of said cap.

2. A coupling head according to claim 1, wherein said shoulder is sealed by welding or gluing to said circular opening of said cap and the end of said cap opposite said annular opening is welded to said base.

3. A coupling head according to claim 1, wherein said fiber holder has an axial channel having three portions with each portion having a different diameter and with the largest diameter receiving a sleeve which surrounds said optical fiber section.

4. A method of fitting an opto-electronic coupling head of the type incorporating a device for supporting an opto-electronic component and including a fiber holder for positioning an optical fiber section and an encapsulating device having a standard semiconductor case kwith a base and a cap which has a circular opening via which said fiber holder extends through said case, said method comprising the steps of:
    forming said fiber holder with a shoulder whose diameter is essentially equal to the internal diameter of said cap; and
    placing said fiber section in said fiber holder wherein during the step of placing said fiber section in said fiber holder a tool is used which has a reference plane against which said fiber holder is supported and said tool has a platform projecting with respect to said reference plane against which bears the terminal face of said fiber section in order to fix the size of the terminal face of said fiber section to obtain optical coupling to said opto-electronic component.

5. A method according to claim 4 comprising the further step of welding said cap to said base by placing said coupling head between two electrodes of an electric welding machine after placing solder between the fiber holder and the edge of said circular opening of said cap located on the upper portion of said cap.

6. A method according to claim 5, wherein said step of welding said cap to said base further comprises the placing of a tin welding preform between said fiber holder and the edge of said circular opening of said cap.

* * * * *